United States Patent [19]
Briehl

[11] Patent Number: 6,139,246
[45] Date of Patent: *Oct. 31, 2000

[54] INTERCHANGEABLE ELECTRONIC CARRIER TAPE FEEDER ADAPTABLE TO VARIOUS SURFACE MOUNT ASSEMBLY MACHINES

[75] Inventor: Martin J. Briehl, Scottsdale, Ariz.

[73] Assignee: Tempo G, Sherman Oaks, Calif.

[ * ] Notice: This patent is subject to a terminal disclaimer.

[21] Appl. No.: 09/225,534

[22] Filed: Jan. 4, 1999

Related U.S. Application Data

[63] Continuation of application No. 08/662,013, Jun. 12, 1996, Pat. No. 5,941,674.

[51] Int. Cl.⁷ ..................................... G07F 11/66
[52] U.S. Cl. ..................... 414/417; 221/25; 221/74; 242/615; 242/615.3
[58] Field of Search ..................... 414/403, 417; 221/25, 70, 71, 74, 211, 236, 241; 226/146, 147, 148; 242/566, 615, 615.3; 156/584

[56] References Cited

U.S. PATENT DOCUMENTS

| | | |
|---|---|---|
| 4,586,670 | 5/1986 | Vvancelette et al. ..................... 242/55 |
| 4,657,158 | 4/1987 | Faes et al. ................................. 221/25 |
| 4,747,553 | 5/1988 | Ogawa .................................. 242/56 R |
| 4,768,915 | 9/1988 | Fujioka .................................... 414/416 |
| 4,810,154 | 3/1989 | Klemmer et al. ....................... 414/416 |
| 4,887,778 | 12/1989 | Soth et al. .............................. 226/109 |
| 4,934,891 | 6/1990 | Hawkswell .............................. 414/223 |
| 5,052,606 | 10/1991 | Cipolla et al. .......................... 226/120 |
| 5,086,559 | 2/1992 | Akatsuchi ................................. 29/834 |
| 5,191,693 | 3/1993 | Umetsu .................................... 29/429 |
| 5,411,622 | 5/1995 | Miyaoka et al. ........................ 156/265 |
| 5,456,001 | 10/1995 | Mori et al. ................................ 29/739 |
| 5,549,265 | 8/1996 | Legrady et al. ......................... 414/412 |
| 5,562,384 | 10/1996 | Alvite et al. ............................ 414/222 |
| 5,941,674 | 8/1999 | Briehl ...................................... 414/417 |

*Primary Examiner*—Thomas J. Brahan
*Attorney, Agent, or Firm*—Thomas I. Rossa; Tony D. Chan; Jerry Fong

[57] ABSTRACT

An apparatus for feeding a carrier tape with successive sprocket holes and indexed pockets for carrying small components, and used in conjunction with various pick and place assembly machines for surface-mounting of the small components onto a printed circuit board or other assembly substrate. The apparatus has an interchangeable electronic feeder adaptable to various surface mount assembly machines and a set of height support adapters. The feeder has both a flip-chip and non flip-chip capabilities. The interchangeable electronic feeder further has a tape guiding assembly, an indexing assembly, an adjustable push-up tool assembly, and a flipping-converting assembly.

6 Claims, 7 Drawing Sheets

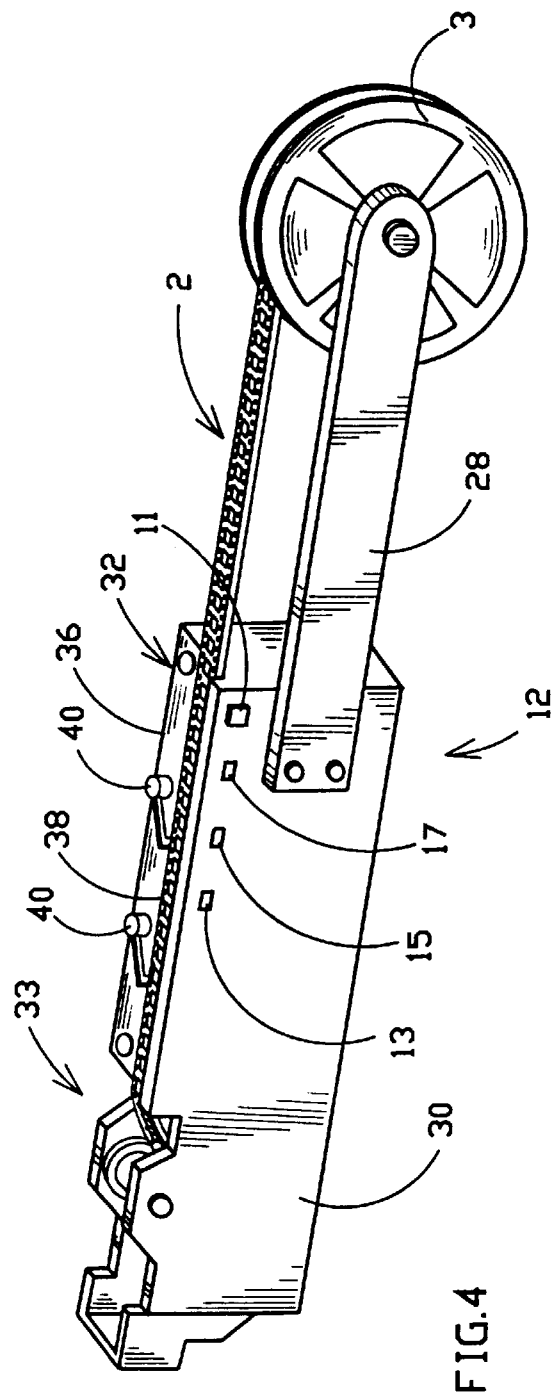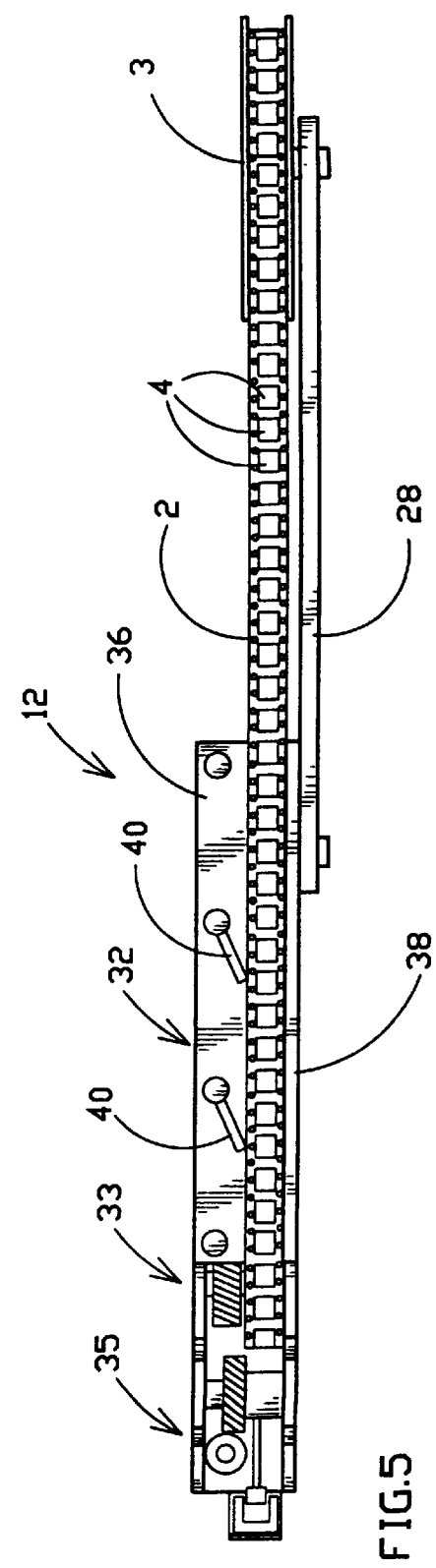

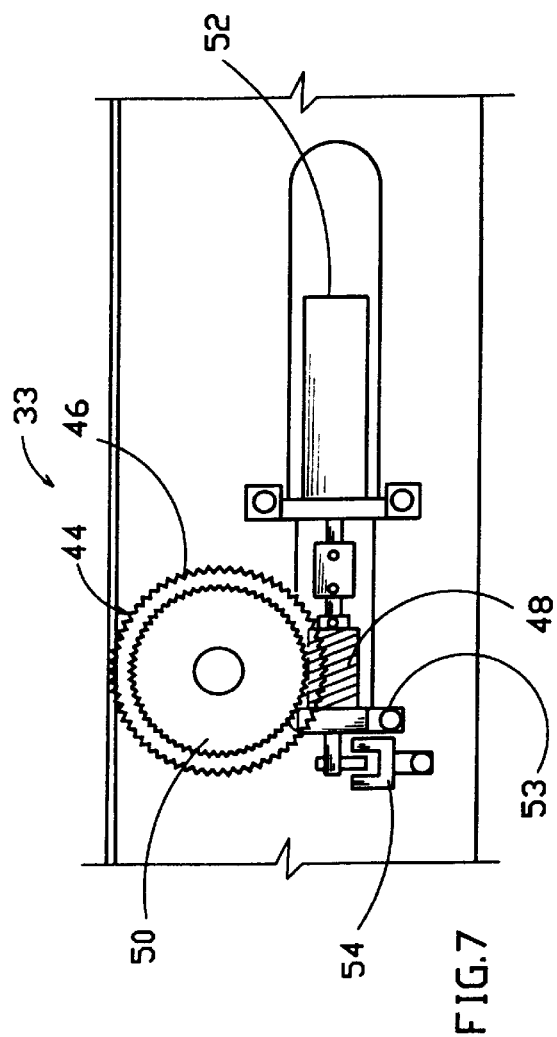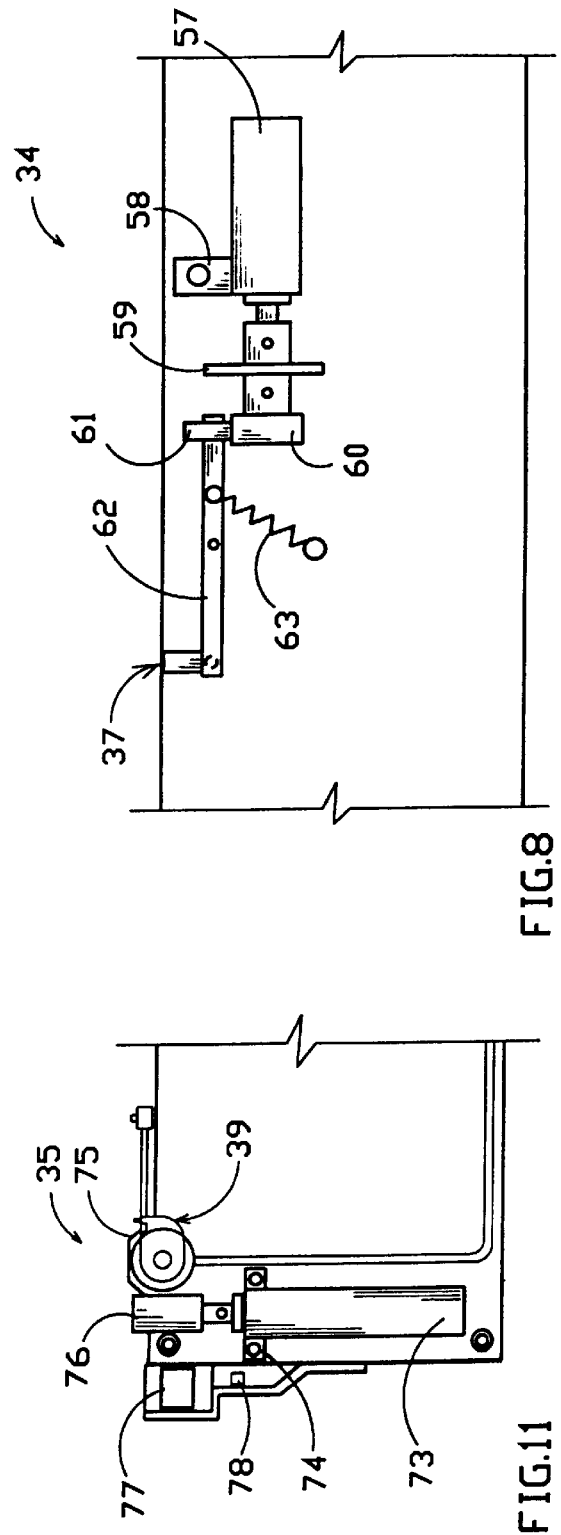

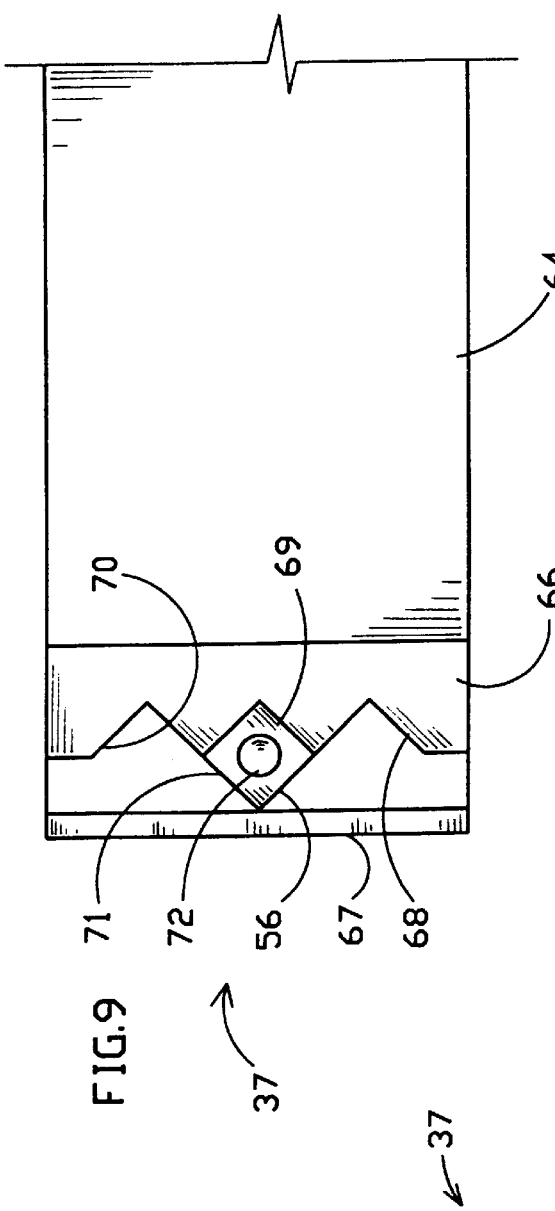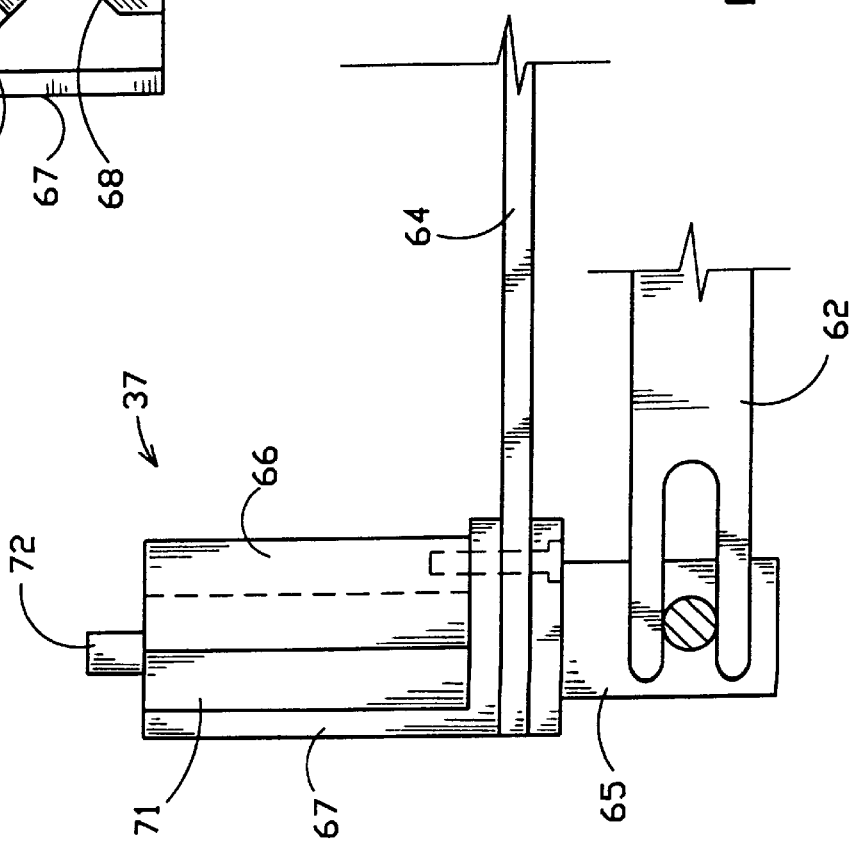

INTERCHANGEABLE ELECTRONIC CARRIER TAPE FEEDER ADAPTABLE TO VARIOUS SURFACE MOUNT ASSEMBLY MACHINES

This application is a continuation application Ser. No. 08/662,013 filed on Jun. 12, 1996, now U.S. Pat. No. 5,941,674.

BACKGROUND OF THE INVENTION

1. Field of the Invention

The present invention generally relates to the field of surface mount assembly machines. More particularly, the present invention relates to the field of an interchangeable electronic carrier tape feeder adaptable for use in various surface mount assembly machines.

2. Description of the Prior Art

Fully automated surface mount assembly machines are used for surface mount operation in populating printed circuit boards (PCB) and are known in the prior art. They dramatically raises the productivity in component assembly and lower the cost of production. Prior art conventional tape feeders, primarily mechanical, plus a few electronic/electromechanical designs, are used in conjunction with these surface mount assembly machines to sequentially index carrier tape containing surface mount electronic components within uniformly spaced cavities and to present these components consistently and repeatedly at a proscribed "dead spot" (aka pick point) for pickup by a vacuum probe and subsequent assembly placement.

A carrier tape packaging assembly with small surface mount components therein is fed through the tape feeder, and the surface mount assembly machine picks up the component at the designated pick point and places the surface mount component on the printed circuit board (PCB). A principal disadvantage with these conventional tape feeders is that they are machine specific and are thus not interchangeable for use with other types of surface mount assembly machines. In other words, virtually every different type and style of conventional tape feeder is manufactured for a particular make and model of surface mount assembly machine and cannot be used with any other type of surface mount assembly machine. This condition creates a proliferation of conventional tape feeders needed in a modem factory where a variety of surface mount assembly machines are often utilized. Typically, the capital investment and floor space requirements for backup tape feeders exceeds the corresponding investment and space requirements for the assembly machine mainframes.

A further disadvantage of conventional tape feeders is their inability to repeatably index and consistently position (at the pick point) extremely small surface mount components, many of which have decreased in size by a power of ten to as small as ten thousandths of an inch per side, and are growing ever smaller.

An additional disadvantage of conventional tape feeders is that they are ill equipped to properly present integrated circuits in the form of singulated bare die sawn from wafers to assembly placement machines. Accurate, repeatable feeding to the pick point, carefully handling of delicate bare die to avoid damage, and especially presenting these bare die in a choice of face up or inverted position to accommodate the mutually popular assembly orientations of chip on board and flip-chip are requirements generally not satisfied by conventional tape feeders, individually, and especially not in totality.

Another disadvantage of conventional tape feeders is that they are dedicated to one specific width of carrier tape and a different feeder must be used for each carrier tape width used. In addition, most conventional tape feeders are dedicated to one and only one component cavity pitch. Thus, when carrier tapes of same width but different component cavity pitches are used, as is often the case, a multiplicity of one width, one pitch feeders, are required.

It is therefore highly desirable to have a very efficient and also very effective design and construction of an interchangeable electronic feeder adaptable to various surface mount assembly machines, thereby eliminating the need to match a particular feeder to a particular surface mount assembly machine. It is also desirable to provide an interchangeable electronic feeder which has both flip-chip and non flip-chip capabilities. It is further desirable to provide an interchangeable electronic feeder which can be used with multiple widths of carrier tapes.

SUMMARY OF THE INVENTION

The present invention is a novel and unique apparatus for feeding a carrier tape with successive sprocket holes and indexed pockets for carrying small components, and used in conjunction with various pick and place assembly machines for surface-mounting of the small components onto a printed circuit board (PCB). The apparatus comprises an interchangeable electronic feeder adaptable to various surface mount assembly machines and a set of height support adapters. The interchangeable electronic feeder has both flip-chip and non flip-chip capabilities. The interchangeable electronic feeder has a low-profile housing which houses a tape guiding assembly, an indexing assembly, an adjustable push-up tool assembly, and a flipping-converting assembly.

It is therefore an object of the present invention to provide a low profile interchangeable electronic feeder which can be employed with various surface mount assembly machines.

It is also an object of the present invention to provide a set of height support adapters so that the interchangeable electronic feeder can be adjusted to the pick height requirement for each surface mount assembly machine.

It is an additional object of the present invention to provide an interchangeable electronic feeder incorporating both flip-chip and non flip-chip capabilities, and capable of accommodating different carrier tape widths.

It is a further object of the present invention to provide an interchangeable electronic feeder with a carrier tape guiding assembly, so that it can accommodate different carrier tape widths.

It is another object of the present invention to provide an interchangeable electronic feeder with a programmable indexing feature, so that the specific component cavity pitch of the carrier tape in use can be readily selected and thereby matched to a range of carrier tape cavity pitch dimensions.

It is still a further object of the present invention to provide an interchangeable electronic feeder with an adjustable push-up tool assembly, so that the adjustable push-up means can raise a small component away from the carrier tape and can be preset in alternate positions to accommodate different carrier tape widths.

It is still another object of the present invention to provide an interchangeable electronic feeder adaptable for use with a conventional AC adapter module which can be used as an alternate power source when plugged into a 110V AC outlet to provide DC power to the interchangeable electronic feeder.

In the preferred embodiment of the present invention, the interchangeable electronic feeder incorporates both flip-chip and non flip-chip capabilities.

In an alternative embodiment of the present invention, the interchangeable electronic feeder comprises only a flip-chip capability.

In another alternative embodiment of the present invention, the interchangeable electronic feeder comprises only a non flip-chip capability, wherein it may be used for a wide range of surface mount components, including but not limited to singulated bare die.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 4 is a perspective view of the interchangeable electronic feeder of the present invention apparatus;

FIG. 5 is a top plan view of the interchangeable electronic feeder of the present invention apparatus;

FIG. 7 is an open side elevational view of the interchangeable electronic feeder, showing the indexing assembly;

FIG. 8 is a perspective view of the interchangeable electronic feeder, showing the adjustable push-up tool assembly;

FIG. 9 is a top plan view of the push-up pin mechanism of the adjustable push-up tool assembly;

FIG. 10 is a side elevational of the push-up pin mechanism of the adjustable push-up tool assembly;

FIG. 11 is a side elevational of the interchangeable electronic feeder, showing the flipping-converting assembly;

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
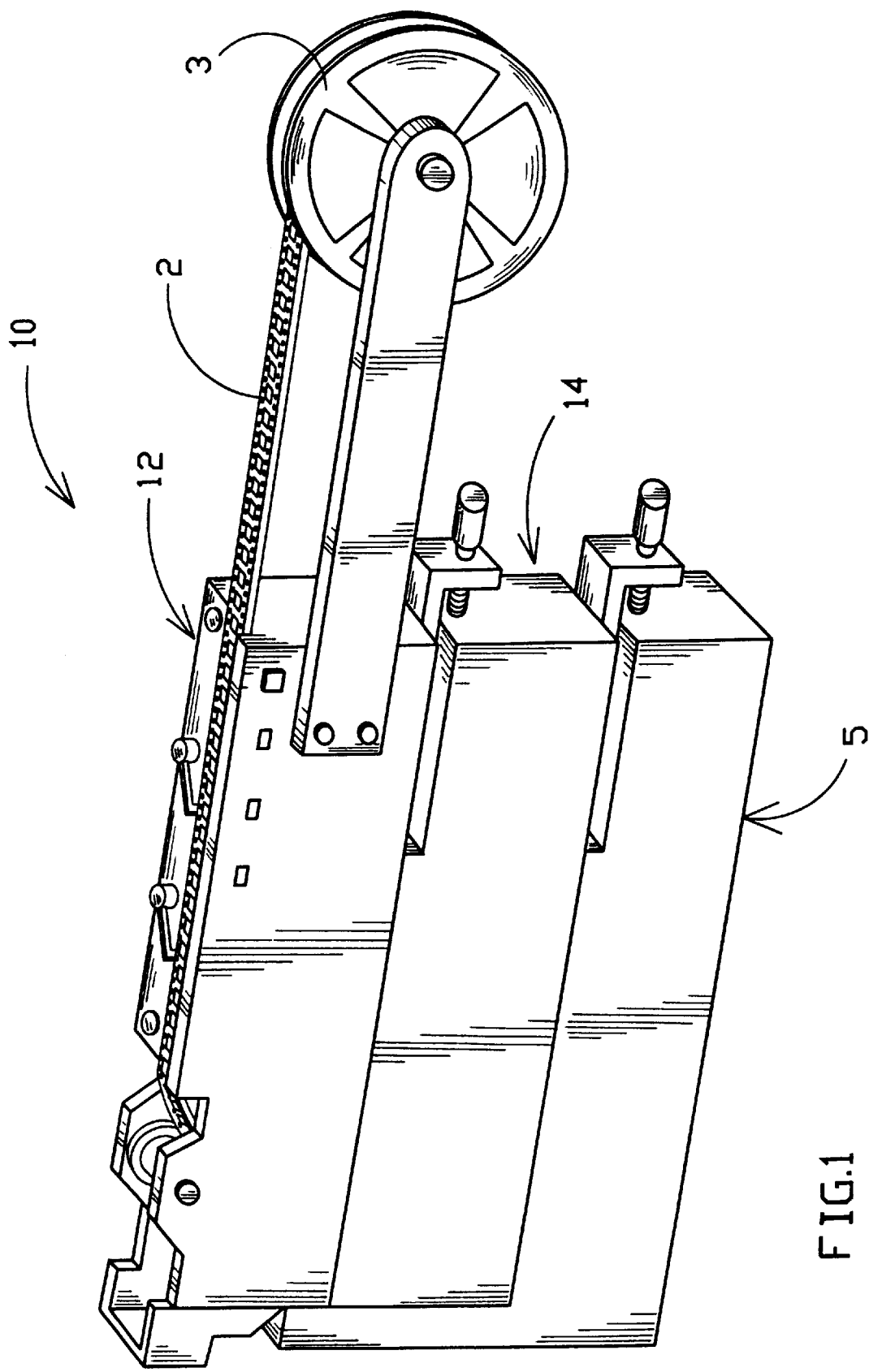
FIG. 1 is an illustration of the present invention apparatus, showing a L-shaped base, an adaptor installed on the L-shaped base and an interchangeable electronic feeder installed on the adaptor.

Referring to FIG. 1, there is shown at 10 a perspective view of the present invention apparatus which comprises an interchangeable electronic feeder 12 interchangeably used in conjunction with the various pick and place assembly machines or surface mount assembly machines (not shown) and a set of height support brackets or adapters 14 (only one is shown). The apparatus 10 is used for feeding a conventional carrier tape 2 with successive sprocket holes (not shown) and indexed pockets 4 for carrying small components (not shown), and used in conjunction with various conventional pick and place assembly machines for surface-mounting of the small components onto a printed circuit board (PCB). The conventional carrier tape 2 is wound up on a conventional reel 3.

Figure 2:
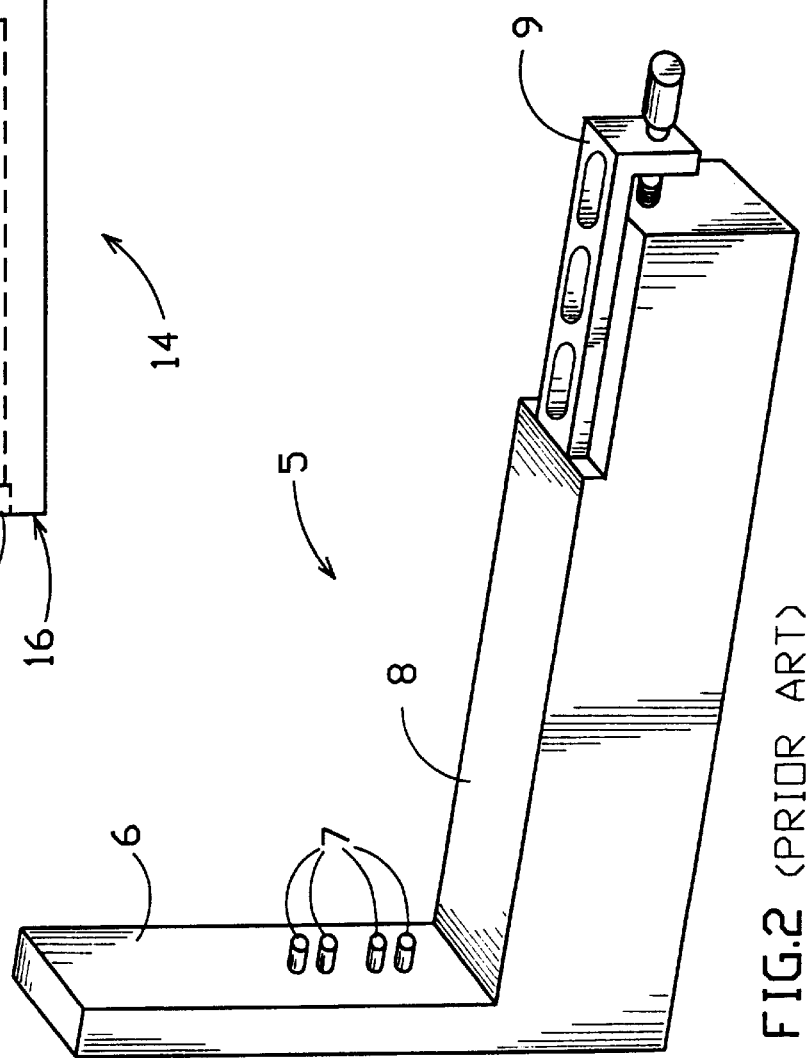
FIG. 2 is a perspective view of the L-shaped base.

A typical configuration of prior art pick and place assembly machines will have a plurality of slot bays which are a typical L-shaped base 5 shown in FIG. 2. The L-shaped base 5 has a vertical power rail 6 with contact pins 7 for supplying power to prior art mechanical feeders (not shown) or the electronic feeder 12. The horizontal support 8 is used for seating the prior art mechanical feeders or the adaptor 14 onto the pick and place assembly machines. The L-shaped base 5 further has a locking means 9 for locking and securing the prior art mechanical feeders or the adaptor 14 of the present invention apparatus 10.

Figure 3:
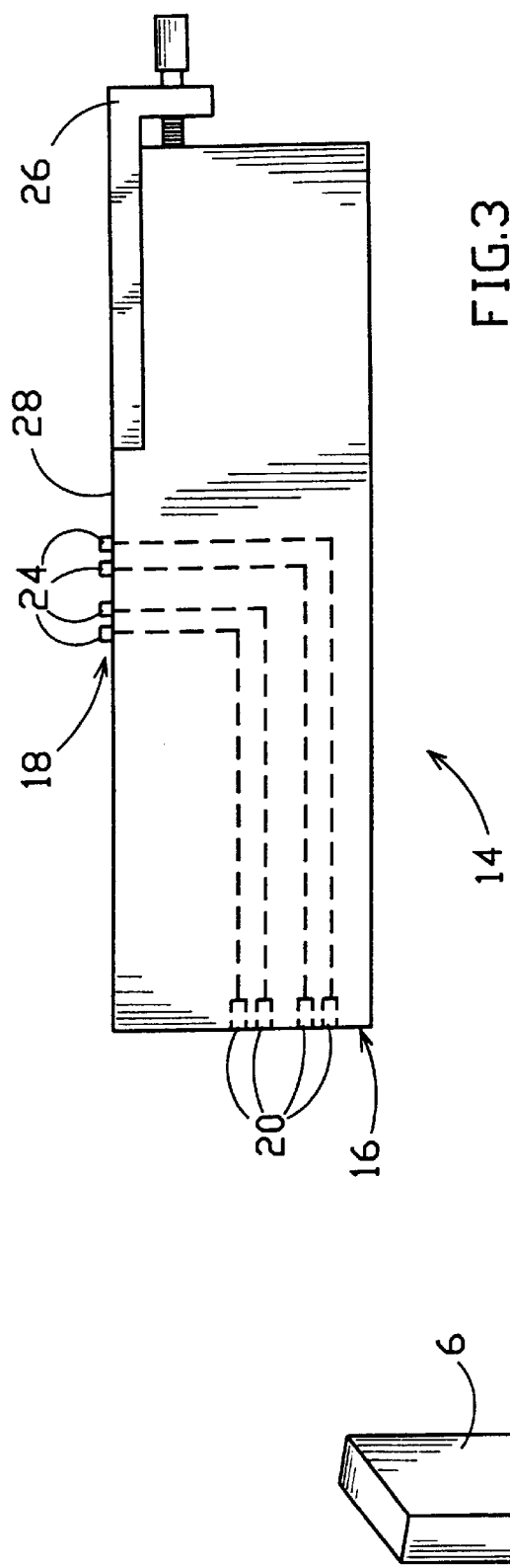
FIG. 3 is a perspective view of one of the height support adapters of the present invention apparatus; invention apparatus.

Referring to FIG. 3, there is shown a side elevational view of one of the set of height support adapters 14 of the present invention apparatus 10. Each adaptor 14 are substantially identical, and to the extent they are, only one will be described in detail.

The principal differences between each of the adapters is that height of the pick point is changed to conform to various pick and place assembly machines and the locating provisions are customized to adapt to each pick and place assembly machine. Referring to FIGS. 1, 2 and 3, the height support adaptor 14 is used for interchangeably mounting the feeder 12 to the various pick and place assembly machines. The adaptor 14 has a first portion 16 which is customized to accommodate one of the various pick and place assembly machines, and a second portion 18 which is common among all the adapters for receiving the electronic feeder 12. The first portion 16 has contact sockets 20 located at one end 22 of the adaptor 14 for establishing electrical and electronic connection with one of the various pick and place assembly machines. The adaptor 14 is installed on the horizontal support 8 of the L-shaped base 5, such that the contact sockets 20 are plugged into the contact pins 7 on the vertical power rail 6 of the L-shaped base 5 and secured thereto by the locking means 9 (see FIG. 1).

The second portion 18 has contact pins 24 located on top 28 of the adaptor 14 for establishing electrical and electronic connection with the feeder 16. The second portion 18 of the adaptor 14 has a locking means 26. The feeder 12 is seated on the top 28 and plugs into the contact pins 24 of the adaptor 14 such that the locking means 26 secures the feeder 12 to the adaptor 14.

The adaptor 14 further comprises internal wires (shown as dashed lines) connected between the contact sockets 20 of the first portion 16 and the contact pins 24 of the second portion 18 for establishing electrical and electronic connection between the feeder 12 and one of the various pick and place assembly machines. For pick and place assembly machines without the vertical power rails or other on board electrical power, a standard, commercially available adapter module (not shown) may be provided with the electronic feeder 12, and plugged into a standard power outlet to provide requisite DC power to the electronic feeder 12.

Figure 6:
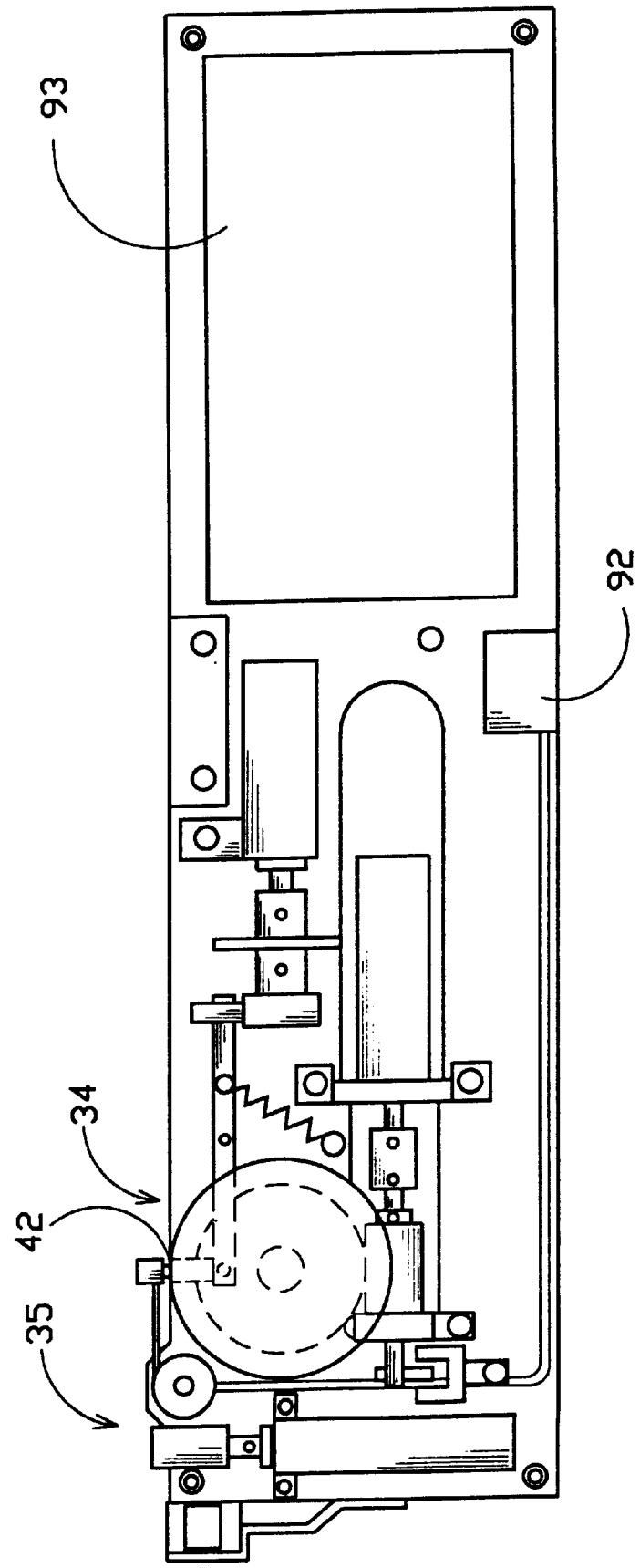
FIG. 6 is an open side elevational view of the interchangeable electronic feeder of the present invention apparatus.

Referring to FIGS. 4, 5, and 6, there are shown respective perspective view, top plan view, and open side elevational view of the electronic feeder 12 of the present invention apparatus. The electronic feeder 12 has a self-contained low-profile housing 30 for housing a carrier tape guiding assembly 32, an indexing assembly 33, an adjustable push-up tool assembly 34, and a flip-converting assembly 35 (see FIG. 8). The feeder 12 is also provided with a longitudinal support bracket 28 which is attached to the side of the housing 30 for retaining the reel 4 that holds the carrier tape 2. The low profile housing 30 further has a switch means 11 for switching the feeder 12 into a flip-chip mode or non flip-chip mode.

The operating voltage for the electronic feeder 12 is approximately 6 VDC and the peak current drain is approximately 500 milliampere (ma). The self-contained low profile housing 30 of the feeder 12 is approximately 2.38" (60.5 mm) from the base to the pick point, for both the flip-chip operation and the non flip-chip operation. The width of the low profile housing 30 is approximately 1.25" (31.8 mm) and the height of the housing without the adaptor is approximately 3.0" (76.2 mm). The pick height is approximately 3.38" (60.5 mm) for both non flip-chip operation or flip-chip operation.

Referring to FIGS. 4 and 5, the carrier tape guiding assembly 32 has means for accommodating different carrier tape widths. The guiding assembly 32 comprises a bottom support plate 36 which is the top of the low profile housing 30 for receiving the carrier tape 2 thereon, a side rail 38 integrally formed with the bottom support plate 36 at right angle, and at least two spaced apart spring-loaded wire guides 40 attached to the bottom support plate 36 and remote from the side rail 38 for biasing the carrier tape 2 inwardly towards the side rail 38 but providing flexibility to accommodate different carrier tape widths. The carrier tape guiding assembly can accommodate multiple carrier tape widths of standard size, such as 8 mm, 12 mm, 16 mm, 24 mm, 32 mm, and 44 mm.

FIG. 7 shows the indexing assembly 33 of the electronic feeder 12. Referring to FIGS. 6 and 7, the indexing assembly 33 comprises a sprocket wheel 44 with sprocket teeth 46 adapted to engage the successive sprocket holes on the carrier tape 2 for advancing the indexed pockets 4 of the carrier tape to a push-up area 42. The sprocket wheel 44 has 30 sprocket teeth 46, wherein each is at approximately 12°. The feeder 12 has means for driving the sprocket wheel 44 which includes a worm wheel shaft 48, a worm wheel 50 (anti-backlash) coupled to the worm wheel shaft 48, an indexing gear motor 52 for driving the worm shaft 48, an index motor mount 53 for holding the indexing gear motor 52, and a sensor means 54 for sensing when to turn on or off the indexing assembly 33. All of these components in the driving means for driving the sprocket wheel are conventional in the art.

The indexing accuracy of the indexing assembly 33 is approximately +/−0.001" (+/−0.025 mm) maximum variation. The indexing time for non flip-chip operation is approximately 300 ms. The indexing time for flip chip operation is approximately 500 ms. The index increment is switch selectable for 2 mm, 4 mm, 8 mm, 12 mm, 16 mm, and 24 mm component cavity pitch, and can be programmed for additional increments if and when required.

Referring to FIG. 8, there is shown a side elevational view of the adjustable push-up tool assembly 34 which comprises a push-up pin mechanism 37 for allowing transverse-position adjustment of a push-up pin 56. The adjustable push-up tool assembly 34 further has means for actuating the push-up pin mechanism 37 to the small components one at a time from the carrier tape 2 when a successive one of the indexed pockets 4 arrives at the push-up area 42. The means includes a lift gear motor 57, a mounting bracket 58 for holding the lift gear motor 57, a lift sensor means 59, a lift cam hub 60, a cam follower 61, a lift lever 62, and a spring means 63 for positively pulling down the lift lever 62 and negatively pulling up the lift lever 62. All of these components in the actuating means for actuating the push-up pin mechanism are conventional in the art.

Referring to FIGS. 9 and 10, there are shown respective top plan view and partial side cross-sectional view of the push-up pin mechanism 37. The push-up pin mechanism 37 includes a leaf spring 64 for flexing in a up and down direction, a yoke 65 mounted underneath the leaf spring 64, a positioning V-shaped groove block 66 mounted above the leaf spring 64 and aligned with the yoke 65 for providing orientation, and a spring clip 67. The positioning V-shaped groove block 66 has a 8 mm slot 68, a 12 mm slot 69 and a 16 mm slot 70 for receiving the push-up pin 56 in one of the three slots such that the spring clip 67 retains the push-up pin 56 therein without the ability to rotate, thus assuring fixed orientation of asymmetric pin tip 72 geometries. The yoke 65 is actuated by the lift lever 62 which in turn moves the leaf spring 64 in the up or down direction which in turns moves the positioning V-shaped groove block 66 which in turn moves the push-up pin 56, thereby pushing the small components one at a time from the carrier tape 2 when the successive one of the indexed pockets 4 arrives at the push-up area 42. The push-up pin 56 has a generally square shaped body 71 with a changeable pin tip 72 to conform to the size and shape of the component to be lifted.

Referring to FIG. 11, there is shown a side elevational view of the flip-converting assembly 35 which has a flipping mechanism 39 for allowing flipping of the singulated bare die. The flip-converting assembly 35 further has means for actuating the flipping mechanism 39 to pick-up and flip the bare die one at a time from the push-up area 42. The flip-converting assembly 35 further includes a flip gear motor 73, a mounting bracket 74 for holding the flip gear motor 73, a worm flip wheel 75, a worm flip shaft 76 coupled with the worm flip wheel 75, and sensor means 77 and 78. All of these components in the actuating means for actuating the flipping mechanism are conventional in the art.

Figures 12, 13:
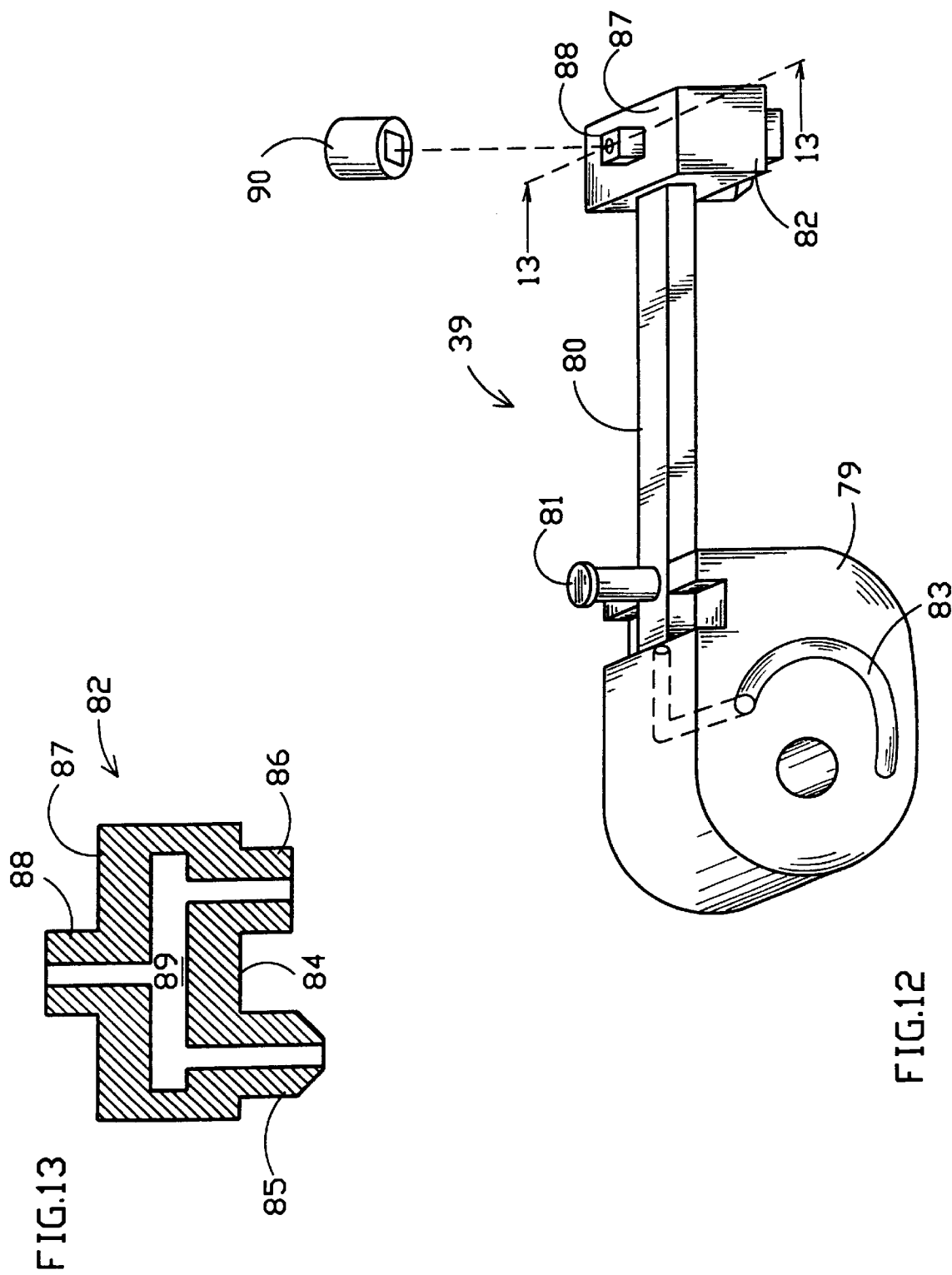
FIG. 12 is a perspective view of the flipping mechanism of the flipping converting assembly.
FIG. 13 is a cross-sectional view taken along line 13—13 of FIG. 12.

FIG. 12 shows a perspective of the flipping mechanism 39 of the flip-converting assembly 35. Referring to FIGS. 11 and 12, the flipping mechanism 39 comprises a vacuum flipper 79, a hollow flipping arm 80 with one end connected to the vacuum flipper 79 by a thumb screw 81, and a head portion 82 connected to the other end of the hollow flipping arm 80. The vacuum flipper 79 has a vacuum groove 83 to serve as a vacuum conduit.

FIG. 13 shows a cross-sectional view of the head portion 82 of the flipping mechanism 39. Referring to FIGS. 11, 12 and 13, the head portion 82 has a top side 84 with two opposite tip receivers 85 and 86, and an opposite bottom side 87 with a central tip receiver 88. Each tip receiver corresponds to the one of the three slots of the positioning V-shaped groove block 66 of the push-up pin mechanism 37 of the adjustable push-up tool assembly 34. The flipping arm 80 swings to the push-up area 42, so that one of the three tip receivers 85, 86 and 87 picks up the singulated bare die one at a time from the carrier tape 2 when the successive one of the indexed pockets 4 arrives at the push-up area 42. The head portion 82 has a hollow channel 89 which connects all of the three tip receivers 85, 86 and 87 for providing vacuum. An active rubber tip 90 is provided on the central tip receiver 88 for assisting in holding the small components.

Two dummy plugs are also provided which are installed on the other two tip receivers 85 and 86. If one of the other tip receivers is utilized, then the tip receiver in use will contain the active rubber tip 90, and the tip receivers which are not utilized will receive the dummy plugs.

Referring to FIG. 6, there is shown a PCB control board means 93 for electrically and electronically connecting to and controlling the carrier tape guiding assembly 32, the indexing assembly 33, the adjustable push-up tool assembly 34, and the flip-converting assembly 35. The control board means 93 has a microprocessor (not shown).

The control circuit changes over between the flip-chip and non flip-chip operation and is switch selectable. The flipping-converting assembly 35 has a built-in miniature 6 volt vacuum pump 92, so no utilities other than electrical power are required. The operator interface consists of a ready light 13, an index increment selector switch 15, a flip-chip/non flip-chip control switch 11, and a manual index/tape feed button 17. The tape advance button 17 is used for quickly advancing the carrier tape in 2 mm increments. When the button is held down, the carrier tape will rapidly advance in successive 2 mm increments so that the carrier tape appears to be moving continuously.

On pick and place assembly machines that require a communications link, e.g., ready/fault status, etc., this may be made available per customer requirements.

The operation of the foregoing embodiment now will be described. The electronic feeder 12 can be switched to a non flip-chip mode or a flip-chip mode by the switch 11. When the electronic feeder 12 is in the non flip-chip mode, the flipping-converting assembly 35 is deactivated, and the pick and place assembly machine is programmed to pick up the small components one at a time from the carrier tape 2 when the successive one of the indexed pockets 2 arrives at the push-up area 42. When the electronic feeder 12 is in the flip-chip mode, the flipping-converting assembly 35 is activated and, the pick and place assembly machine is programmed to pick up the small components one at a time from the flipping mechanism 39 of the flipping-converting assembly 35.

For a non-flip operation, the feeder is powered up, the microprocessor will check the lift pin down sensor and if the pin is not down, the lift motor will run until it is down. Next the home sensor for the index motor will be sensed and if the index shaft is not at home the index motor will move it to home position. At this point, the green light will be turned on. The processor will then go into a loop, polling the push buttons and the nozzle sensor. When the nozzle sensor senses that the vacuum nozzle of the surface mount assembly machine is approaching, it will start a time delay; when the time delay expires, the lift pin motor will start and it will stop when the lift sensor senses that the lift pin is up. When the nozzle sensor senses that the nozzle has departed, then the lift motor will start again and stop when it arrives at the down position as detected by the second lift sensor. When the second sensor senses that the pin is down, the index motor will be turned on and will be turned off at the end of one index increment.

For a flip-chip operation, the feeder is powered up, the microprocessor will check the lift pin down sensor and if the pin is not down, the lift motor will run until it is down. Next the home sensor for the index motor will be sensed and if the index shaft is not at home the index motor will move it to home position. At this point, the green light will be turned on. When the sensor at the pick-up area is activated indicating that the flip over arm is at the pick-up area, the vacuum pump will be activated and the push up pin motor will be activated. It will stop when the lift pin reaches to the top of the stroke. At this time, the flip arm motor will be activated. As soon as the sensor at the pick-up area senses that the flip arm has cleared the sensor, the lift pin motor will be activated; it will stop when the lift pin reaches to the bottom of the stroke as sensed by the down sensor. At this time, the index motor will be activated. The flip arm motor will stop when the sensor at the delivery end senses that the arm has arrived at that location. The vacuum will then be shut off. When the delivery end sensors senses the arrival of the pickup nozzle from the surface mount assembly machine nothing will happen until the sensor sees that the assembly machine nozzle has picked the die and is away from the pick point. At that time, the flip arm motor will be activated in the reverse direction. When the pick up point sensor senses the arrival of the flip arm the vacuum will be turned on and the lift pin motor will be turned on starting another sequence. If, when the unit is powered up, the pickup point sensor does not sense the presence of the flip arm because it is at the delivery point, the flip arm motor will be activated to return the arm to the pickup point. When its arrival at the pickup point is sensed, the lift pin sequence will start.

The present invention conforms to conventional forms of manufacture or any other conventional way known to one skilled in the art.

It will be appreciated that the interchangeable electronic feeder 12 may be manufactured with only the flip-chip capability or non flip-chip capability.

For example, the embodiments of the present invention hereinbefore described do not include means for the removal of a cover carrier tape from the carrier tape normally used with carrier tape configurations defined by United States, National and International standards, including IEC 286-3, DIN IEC 288 part 3, EIA 481 and JIS-C-0806. Such cover tape removal means are generally included on current version of all conventional tape feeders, are well known in the art, and can be readily incorporated in the present invention to permit use with conventional carrier tapes containing cover tapes, the removal of which is essential to allow pick up of electronic components from their respective carrier tape cavities.

Defined in detail, the present invention is an apparatus for feeding a carrier tape with successive sprocket holes and indexed pockets for carrying small components, and used in conjunction with various pick and place assembly machines for surface-mounting of the small components onto a printed circuit board (PCB), the apparatus comprising: (a) an electronic feeder which can be interchangeably used in conjunction with the various pick and place assembly machines; (b) a set of adapters for interchangeably mounting the feeder to the various pick and place assembly machines, each adapter having a first portion which is customized to accommodate one of the various pick and place assembly machines, and a second portion which is common among all adapters for receiving the feeder; (c) the first portion of the each adapter having means for establishing electrical and electronic connection with the one of the various pick and place assembly machines, and means for mounting and securing the each adapter to the one of the various pick and place assembly machines; (d) the second portion of the each adapter having means for establishing electrical and electronic connection with the feeder, and means for mounting and securing the feeder to the each adapter; (e) the each adapter further comprising internal means between the first and second portions for establishing electrical and electronic connection between the feeder and the one of the various pick and place assembly machines; (f) the feeder having a self-contained low-profile housing for housing a carrier tape guiding assembly, an indexing assembly, an adjustable push-up tool assembly, and a flip-converting assembly; (g) the carrier tape guiding assembly having means for accommodating different carrier tape widths, including a bottom support plate for receiving the carrier tape thereon, a side rail integrally formed with the bottom support plate at right angle, and a multiplicity of spaced apart spring-loaded wire guides attached to the bottom support plate and remote from the side rail for biasing the carrier tape inwardly towards the side rail but providing flexibility to accommodate different carrier tape widths; (h) the indexing assembly having a sprocket wheel with sprocket teeth adapted to engage the successive sprocket holes on the carrier tape for advancing the indexed pockets of the carrier tape to a push-up area, and means for driving the sprocket wheel; (i) the adjustable push-up tool assembly having a push-up pin mechanism for allowing transverse-position adjustment of a push-up pin, and means for actuating the push-up pin mechanism to the small components one at a time from the carrier tape when a successive one of the indexed pockets arrives at the push-up area; (j) the flip-converting assembly having a flipping mechanism for allowing flipping of the small components (especially singulated bare die), and means for actuating the flipping mechanism to pick up and flip the small components one at a time from the push-up area; and (k) a control means electrically and electronically connected to and controlling the carrier tape guiding assembly, the indexing assembly, the adjustable push-up tool assembly, and the flip-converting assembly, and means for switching between a non flip-chip mode and a flip-chip mode; (l) whereby when the electronic feeder is in the non flip-chip mode, the vacuum probe of the one of the pick and place assembly machines picks up the small components one at a time from the carrier tape when the successive one of the indexed pockets arrives at the push-up area or when the electronic feeder is in the flip-chip mode, the vacuum probe of the one of the pick and place assembly machines picks up the small components one at a time from the flipping mechanism of the flip-converting assembly.

Defined broadly, the present invention is an apparatus for feeding a carrier tape with successive sprocket holes and indexed pockets for carrying small components, and used in conjunction with a pick and place assembly machine for surface-mounting of the small components onto a printed circuit board (PCB), the apparatus comprising: (a) an electronic feeder which can be interchangeably used in conjunction with the pick and place assembly machine; (b) at least one adapter for interchangeably mounting the feeder to the pick and place assembly machine, and having a first portion which is customized to accommodate the pick and place assembly machine, and a second portion for receiving the feeder; (c) the first portion of the at least one adapter having means for establishing electrical and electronic connection with the pick and place assembly machine, and means for mounting and securing the at least one adapter to the pick and place assembly machine; (d) the second portion of the at least one adapter having means for establishing electrical and electronic connection with the feeder, and means for mounting and securing the feeder to the at least one adapter; (e) the at least one adapter further comprising internal means between the first and second portions for establishing electrical and electronic connection between the feeder and the pick and place assembly machine; (f) the feeder having a self-contained low-profile housing for housing a carrier tape guiding assembly, an indexing assembly, an adjustable push-up tool assembly, and a flip-converting assembly; (g) the carrier tape guiding assembly having means for accommodating different carrier tape widths, including a bottom support plate for receiving the carrier tape thereon, a side rail integrally formed with the bottom support plate at right angle, and a multiplicity of spaced apart spring-loaded wire guides attached to the bottom support plate and remote from the side rail for biasing the carrier tape inwardly towards the side rail but providing flexibility to accommodate different carrier tape widths; (h) the indexing assembly having a sprocket wheel with sprocket teeth adapted to engage the successive sprocket holes on the carrier tape for advancing the indexed pockets of the carrier tape to a push-up area, and means for driving the sprocket wheel; (i) the adjustable push-up tool assembly having a push-up pin mechanism for allowing transverse-position adjustment of a push-up pin, and means for actuating the push-up pin mechanism to the small components one at a time from the carrier tape when a successive one of the indexed pockets arrives at the push-up area; (j) the flip-converting assembly having a flipping mechanism for allowing flipping of the small components, and means for actuating the flipping mechanism to pick up and flip the small components one at a time from the push-up area; and (k) a control means electrically and electronically connected to and controlling the carrier tape guiding assembly, the indexing assembly, the adjustable push-up tool assembly, and the flip-converting assembly, and means for switching between a non flip-chip mode and a flip-chip mode; (l) whereby when the electronic feeder is in the non flip-chip mode, the pick and place assembly machine picks up the small components one at a time from directly the carrier tape when the successive one of the indexed pockets arrives at the push-up area or when the electronic feeder is in the flip-chip mode, the pick and place assembly machine picks up the small components one at a time from the flipping mechanism of the flip-converting assembly.

Defined more broadly, the present invention is an electronic feeder for feeding a carrier tape with successive sprocket holes and indexed pockets for carrying small components, the electronic feeder comprising: (a) a self-contained low-profile housing for housing a carrier tape guiding assembly, an indexing assembly, an adjustable push-up tool assembly, and a flip-converting assembly; (b) the carrier tape guiding assembly having means for accommodating different carrier tape widths, including a bottom support plate for receiving the carrier tape thereon, a side rail integrally formed with the bottom support plate at right angle, and a multiplicity of spaced apart spring-loaded wire guides attached to the bottom support plate and remote from the side rail for biasing the carrier tape inwardly towards the side rail but providing flexibility to accommodate different carrier tape widths; (c) the indexing assembly having a sprocket wheel with sprocket teeth adapted to engage the successive sprocket holes on the carrier tape for advancing the indexed pockets of the carrier tape to a push-up area, and means for driving the sprocket wheel; (d) the adjustable push-up tool assembly having a push-up pin mechanism for allowing transverse-position adjustment of a push-up pin, and means for actuating the push-up pin mechanism to the small components one at a time from the carrier tape when a successive one of the indexed pockets arrives at the push-up area; (e) the flip-converting assembly having a flipping mechanism for allowing flipping of the small components, and means for actuating the flipping mechanism to pick up and flip the small components one at a time from the push-up area; and (f) a control means electrically and electronically connected to and controlling the carrier tape guiding assembly, the indexing assembly, the adjustable push-up tool assembly, and the flip-converting assembly, and means for switching between a non flip-chip mode and a flip-chip mode; (g) whereby when the electronic feeder is in the non flip-chip mode, the small components are picked up one at a time directly from the carrier tape when the successive one of the indexed pockets arrives at the push-up area or when the electronic feeder is in the flip-chip mode, the small components are picked up one at a time from the flipping mechanism of the flip-converting assembly.

Defined even more broadly, the present invention is an electronic feeder for feeding a carrier tape with successive sprocket holes and indexed pockets for carrying small components, the electronic feeder comprising: (a) a low-profile housing for housing a carrier tape guiding assembly, an indexing assembly, a push-up tool assembly, and a flip-converting assembly; (b) the carrier tape guiding assembly having means for accommodating different carrier tape widths, including a bottom support plate, a side rail, and at least two spaced apart spring-loaded wire guides for biasing the carrier tape inwardly towards the side rail but providing flexibility to accommodate different carrier tape widths; (c) the indexing assembly having means adapted to engage the successive sprocket holes on the carrier tape for advancing the indexed pockets of the carrier tape to a push-up area; (d) the push-up tool assembly having a push-up pin mechanism for allowing transverse-position adjustment of a push-up pin, and means for actuating the push-up pin mechanism to the small components one at a time from the carrier tape when a successive one of the indexed pockets arrives at the push-up area; (e) the flip-converting assembly having a flipping mechanism for allowing flipping of the small components, and means for actuating the flipping mechanism to pick up and flip the small components one at a time from the push-up area; and (f) a control means electrically and electronically connected to and controlling the carrier tape guiding assembly, the indexing assembly, the push-up tool assembly, and the flip-converting assembly; (g) whereby the small components are picked up one at a time directly from the carrier tape when the successive one of the indexed pockets arrives at the push-up area or the small components are picked up one at a time from the flipping mechanism of the flip-converting assembly.

Defined further broadly, the present invention is a feeder for feeding a carrier tape with successive sprocket holes and indexed pockets for carrying small components, the feeder comprising: (a) a housing for housing a carrier tape guiding means, an indexing means, a push-up means, and a flip-converting means; (b) the carrier tape guiding means for accommodating different carrier tape widths; (c) the indexing means for engaging the successive sprocket holes on the carrier tape and advancing the indexed pockets of the carrier tape to a push-up area; (d) the push-up means for allowing transverse-position adjustment of a push-up pin and actuating the push-up pin to the small components one at a time from the carrier tape when a successive one of the indexed pockets arrives at the push-up area; (e) the flip-converting means for allowing flipping of the small components one at a time from the push-up area; and (f) a control means electrically and electronically connected to and controlling the carrier tape guiding means, the indexing means, the push-up means, and the flip-converting means; (g) whereby the small components are picked up one at a time directly from the carrier tape when the successive one of the indexed pockets arrives at the push-up area or the small components are picked up one at a time from the flip-converting means.

Defined further more broadly, the present invention is a feeder for feeding a carrier tape with successive sprocket holes and indexed pockets for carrying small components, the feeder comprising: (a) a housing; (b) means for accommodating different carrier tape widths; (c) means for engaging the successive sprocket holes on the carrier tape and advancing the indexed pockets of the carrier tape to a push-up area; (d) means for allowing transverse-position adjustment of a push-up pin to push-up the small components one at a time from the carrier tape when a successive one of the indexed pockets arrives at the push-up area; (e) means for allowing flipping of the small components one at a time from the push-up area; and (f) means electrically and electronically connected to and controlling the means for accommodating, the means for engaging and advancing, the means for allowing transverse-position adjustment, and the means for allowing flipping; (g) whereby the small components are picked up one at a time from the carrier tape when the successive one of the indexed pockets arrives at the push-up area or the small components are picked up one at a time from the means for allowing flipping.

Alternatively defined in detail, the present invention is an apparatus for feeding a carrier tape with successive sprocket holes and indexed pockets for carrying small components, and used in conjunction with various pick and place assembly machines for surface-mounting of the small components onto a printed circuit board (PCB), the apparatus comprising: (a) an electronic feeder which can be interchangeably used in conjunction with the various pick and place assembly machines; (b) a set of adapters for interchangeably mounting the feeder to the various pick and place assembly machines, each adapter having a first portion which is customized to accommodate one of the various pick and place assembly machines, and a second portion which is common among all adapters for receiving the feeder; (c) the first portion of the each adapter having means for establishing electrical and electronic connection with the one of the various pick and place assembly machines, and means for mounting and securing the each adapter to the one of the various pick and place assembly machines; (d) the second portion of the each adapter having means for establishing electrical and electronic connection with the feeder, and means for mounting and securing the feeder to the each adapter; (e) the each adapter further comprising internal means between the first and second portions for establishing electrical and electronic connection between the feeder and the one of the various pick and place assembly machines; (f) the feeder having a self-contained low-profile housing for housing a carrier tape guiding assembly, an indexing assembly, and an adjustable push-up tool assembly; (g) the carrier tape guiding assembly having means for accommodating different carrier tape widths, including a bottom support plate for receiving the carrier tape thereon, a side rail integrally formed with the bottom support plate at right angle, and a multiplicity of spaced apart spring-loaded wire guides attached to the bottom support plate and remote from the side rail for biasing the carrier tape inwardly towards the side rail but providing flexibility to accommodate different carrier tape widths; (h) the indexing assembly having a sprocket wheel with sprocket teeth adapted to engage the successive sprocket holes on the carrier tape for advancing the indexed pockets of the carrier tape to a push-up area, and means for driving the sprocket wheel; (i) the adjustable push-up tool assembly having a push-up pin mechanism for allowing transverse-position adjustment of a push-up pin, and means for actuating the push-up pin mechanism to push-up the small components one at a time from the carrier tape when a successive one of the indexed pockets arrives at the push-up area; and (j) a control means electrically and electronically connected to and controlling the carrier tape guiding assembly, the indexing assembly, and the adjustable push-up tool assembly; (k) whereby the vacuum nozzle of the one of the pick and place assembly machines picks up the small components one at a time from the carrier tape when the successive one of the indexed pockets arrives at the push-up area.

Alternatively defined broadly, the present invention is an apparatus for feeding a carrier tape with successive sprocket holes and indexed pockets for carrying small components, and used in conjunction with a pick and place assembly machine for surface-mounting of the small components onto a printed circuit board (PCB), the apparatus comprising: (a) an electronic feeder which can be interchangeably used in conjunction with the pick and place assembly machine; (b) at least one adapter for interchangeably mounting the feeder to the pick and place assembly machine, and having a first portion which is customized to accommodate the pick and place assembly machine, and a second portion for receiving the feeder; (c) the first portion of the at least one adapter having means for establishing electrical and electronic connection with the pick and place assembly machine, and means for mounting and securing the at least one adapter to the pick and place assembly machine; (d) the second portion of the at least one adapter having means for establishing electrical and electronic connection with the feeder, and means for mounting and securing the feeder to the at least one adapter; (e) the at least one adapter further comprising internal means between the first and second portions for establishing electrical and electronic connection between the feeder and the pick and place assembly machine; (f) the feeder having a self-contained low-profile housing for housing a carrier tape guiding assembly, an indexing assembly, and an adjustable push-up tool assembly; (g) the carrier tape guiding assembly having means for accommodating different carrier tape widths, including a bottom support plate for receiving the carrier tape thereon, a side rail integrally formed with the bottom support plate at right angle, and a multiplicity of spaced apart spring-loaded wire guides attached to the bottom support plate and remote from the side rail for biasing the carrier tape inwardly towards the side rail but providing flexibility to accommodate different carrier tape widths; (h) the indexing assembly having a sprocket wheel with sprocket teeth adapted to engage the successive sprocket holes on the carrier tape for advancing the indexed pockets of the carrier tape to a push-up area, and means for driving the sprocket wheel; (i) the adjustable push-up tool assembly having a push-up pin mechanism for allowing transverse-position adjustment of a push-up pin, and means for actuating the push-up pin mechanism to push-up the small components one at a time from the carrier tape when a successive one of the indexed pockets arrives at the push-up area; and (j) a control means electrically and electronically connected to and controlling the carrier tape guiding assembly, the indexing assembly, and the adjustable push-up tool assembly; (k) whereby the pick and place assembly machine picks up the small components one at a time directly from the carrier tape when the successive one of the indexed pockets arrives at the push-up area.

Alternatively defined more broadly, the present invention is an electronic feeder for feeding a carrier tape with successive sprocket holes and indexed pockets for carrying small components, the electronic feeder comprising: (a) a self-contained low-profile housing for housing a carrier tape guiding assembly, an indexing assembly, and an adjustable push-up tool assembly; (b) the carrier tape guiding assembly having means for accommodating different carrier tape widths, including a bottom support plate for receiving the carrier tape thereon, a side rail integrally formed with the bottom support plate at right angle, and a multiplicity of spaced apart spring-loaded wire guides attached to the bottom support plate and remote from the side rail for biasing the carrier tape inwardly towards the side rail but providing flexibility to accommodate different carrier tape widths; (c) the indexing assembly having a sprocket wheel with sprocket teeth adapted to engage the successive sprocket holes on the carrier tape for advancing the indexed pockets of the carrier tape to a push-up area, and means for driving the sprocket wheel; (d) the adjustable push-up tool assembly having a push-up pin mechanism for allowing transverse-position adjustment of a push-up pin, and means for actuating the push-up pin mechanism to push-up the small components one at a time from the carrier tape when a successive one of the indexed pockets arrives at the push-up area; and (e) a control means electrically and electronically connected to and controlling the carrier tape guiding assembly, the indexing assembly, and the adjustable push-up tool assembly; (f) whereby the small components are picked up one at a time directly from the carrier tape when the successive one of the indexed pockets arrives at the push-up area.

Alternatively defined even more broadly, the present invention is an electronic feeder for feeding a carrier tape with successive sprocket holes and indexed pockets for carrying small components, the electronic feeder comprising: (a) a low-profile housing for housing a carrier tape guiding assembly, an indexing assembly, and a push-up tool assembly; (b) the carrier tape guiding assembly having means for accommodating different carrier tape widths, including a bottom support plate, a side rail, and at least two spaced apart spring-loaded wire guides for biasing the carrier tape inwardly towards the side rail but providing flexibility to accommodate different carrier tape widths; (c) the indexing assembly having means adapted to engage the successive sprocket holes on the carrier tape for advancing the indexed pockets of the carrier tape to a push-up area; (d) the push-up tool assembly having a push-up pin mechanism for allowing transverse-position adjustment of a push-up pin, and means for actuating the push-up pin mechanism to push-up the small components one at a time from the carrier tape when a successive one of the indexed pockets arrives at the push-up area; and (e) a control means electrically and electronically connected to and controlling the carrier tape guiding assembly, the indexing assembly, and the push-up tool assembly; (f) whereby the small components are picked up one at a time directly from the carrier tape when the successive one of the indexed pockets arrives at the push-up area.

Alternatively defined further broadly, the present invention is a feeder for feeding a carrier tape with successive sprocket holes and indexed pockets for carrying small components, the feeder comprising: (a) a housing for housing a carrier tape guiding means, an indexing means, and a push-up means; (b) the carrier tape guiding means for accommodating different carrier tape widths; (c) the indexing means for engaging the successive sprocket holes on the carrier tape and advancing the indexed pockets of the carrier tape to a push-up area; (d) the push-up means for allowing transverse-position adjustment of a push-up pin and actuating the push-up pin to push-up the small components one at a time from the carrier tape when a successive one of the indexed pockets arrives at the push-up area; and (e) a control means electrically and electronically connected to and controlling the carrier tape guiding means, the indexing means, and the push-up means; (f) whereby the small components are picked up one at a time from the carrier tape when the successive one of the indexed pockets arrives at the push-up area.

Alternatively defined further more broadly, the present invention is a feeder for feeding a carrier tape with successive sprocket holes and indexed pockets for carrying small components, the feeder comprising: (a) a housing; (b) means for accommodating different carrier tape widths; (c) means for engaging the successive sprocket holes on the carrier tape and advancing the indexed pockets of the carrier tape to a push-up area; (d) means for allowing transverse-position adjustment of a push-up pin to push-up the small components one at a time from the carrier tape when a successive one of the indexed pockets arrives at the push-up area; and (e) means electrically and electronically connected to and controlling the means for accommodating, the means for engaging and advancing, and the means for allowing transverse-position adjustment; (f) whereby the small components are picked up one at a time from the carrier tape when the successive one of the indexed pockets arrives at the push-up area.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A feeder for feeding a carrier tape with successive sprocket holes and indexed pockets for carrying small components, the feeder comprising:
    a. a housing for housing a carrier tape guiding means, an indexing means, and a push-up means;
    b. said carrier tape guiding means having a continuously self-adjusting single tape guide channel for accommodating different carrier tape widths, including at least two spring-loaded arms for biasing said carrier tape but providing flexibility to accommodate different widths of said carrier tape;
    c. said indexing means for engaging said successive sprocket holes on said carrier tape and advancing said indexed pockets of said carrier tape to a push-up area;
    d. said push-up means for allowing transverse-position adjustment of a push-up pin and actuating the push-up pin to push-up said small components one at a time from said carrier tape when a successive one of said indexed pockets arrives at said push-up area; and
    e. a control means electrically and electronically connected to and controlling said indexing means and said push-up means;
    f. whereby said small components are picked up one at a time directly from said carrier tape when the successive one of said indexed pockets arrives at said push-up area.

2. The feeder in accordance with claim 1 further comprising a set of adapters for interchangeably mounting said housing to various pick and place assembly machines.

3. The feeder in accordance with claim 1 further comprising a flip-converting means for allowing flipping of said small components one at a time from said push-up area.

4. A feeder for feeding a carrier tape with successive sprocket holes and indexed pockets for carrying small components, the feeder comprising:
    a. a housing;
    b. means for accommodating different carrier tape widths, including a continuously self-adjusting single tape guide channel and at least two spring-loaded arms for biasing said carrier tape but providing flexibility to accommodate different widths of said carrier tape;
    c. means for engaging said successive sprocket holes on said carrier tape and advancing said indexed pockets of said carrier tape to a push-up area;
    d. means for allowing transverse-position adjustment of a push-up pin and actuating the push-up pin to push-up each of said small components one at a time from said carrier tape when a successive one of said indexed pockets arrives at said push-up area; and
    e. means electrically and electronically connected to and controlling said engaging and advancing means, and said transverse-position adjustment means;
    f. whereby said small components are picked up one at a time directly from said carrier tape when the successive one of said indexed pockets arrives at said push-up area.

5. The feeder in accordance with claim 4 further comprising a set of adapters for interchangeably mounting said housing to various pick and place assembly machines.

6. The feeder in accordance with claim 4 further comprising means for allowing flipping of said small components one at a time from said push-up area.

* * * * *